US006793796B2

(12) United States Patent
Reid et al.

(10) Patent No.: US 6,793,796 B2
(45) Date of Patent: Sep. 21, 2004

(54) ELECTROPLATING PROCESS FOR AVOIDING DEFECTS IN METAL FEATURES OF INTEGRATED CIRCUIT DEVICES

(75) Inventors: Jonathan D. Reid, Sherwood, OR (US); David Smith, Lake Oswego, OR (US); Steven T. Mayer, Lake Oswego, OR (US); Jon Henri, West Linn, OR (US); Sesha Varadarajan, Wilsonville, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/796,856

(22) Filed: Feb. 28, 2001

(65) Prior Publication Data

US 2001/0015321 A1 Aug. 23, 2001

Related U.S. Application Data

(63) Continuation-in-part of application No. 09/410,170, filed on Sep. 30, 1999, now abandoned.
(60) Provisional application No. 60/105,699, filed on Oct. 26, 1998.

(51) Int. Cl.[7] .......................... C25D 5/18; H01L 21/768
(52) U.S. Cl. ...................... 205/102; 205/103; 205/104; 205/118; 205/123; 205/149; 205/157; 205/186; 205/187; 205/219
(58) Field of Search ................................ 205/102, 103, 205/104, 107, 108, 118, 123, 149, 157, 186, 187, 219, 296, 297, 298; 438/625, 627

(56) References Cited

U.S. PATENT DOCUMENTS

| | | | |
|---|---|---|---|
| 2,733,198 A | 1/1956 | Nobel et al. ................... 204/52 |
| 2,842,488 A | 7/1958 | Strauss et al. ................. 204/52 |
| 2,882,209 A | 4/1959 | Brown et al. .................. 204/52 |
| 2,972,572 A | 2/1961 | Cope, Jr. et al. .............. 204/52 |
| 3,956,120 A | 5/1976 | Kardos et al. ............. 204/52 R |
| 4,092,226 A | 5/1978 | Laing et al. ................... 204/51 |
| 4,272,335 A | * 6/1981 | Combs |
| 4,461,680 A | 7/1984 | Lashmore |
| 4,555,315 A | 11/1985 | Barbieri et al. ........... 204/52 R |
| 4,563,399 A | * 1/1986 | Wright, Jr. |
| 5,232,575 A | 8/1993 | Dodd .......................... 205/238 |
| 5,252,196 A | 10/1993 | Sonnenberg et al. ........ 205/296 |
| 5,618,634 A | 4/1997 | Hosoda et al. .............. 428/610 |
| 5,935,762 A | 8/1999 | Dai et al. .................... 430/312 |
| 5,936,707 A | 8/1999 | Nguyen et al. ............... 355/18 |
| 5,939,788 A | 8/1999 | McTeer ....................... 257/751 |
| 5,972,192 A | 10/1999 | Dubin et al. ................ 205/101 |

(List continued on next page.)

OTHER PUBLICATIONS

Mayer et al., "Process for Electroplating Metals Into Microscopic Recessed Features," Application No. 09/716,016, Nov. 16, 2000, 90 Pages.

(List continued on next page.)

Primary Examiner—Roy King
Assistant Examiner—William T. Leader
(74) Attorney, Agent, or Firm—Beyer, Weaver & Thomas, LLP.

(57) ABSTRACT

Electroplating methods using an electroplating bath containing metal ions and a suppressor additive, an accelerator additive, and a leveler additive, together with controlling the current density applied to a substrate, avoid defects in plated films on substrates having features with a range of aspect ratios, while providing good filling and thickness distribution. The methods include, in succession, applying DC cathodic current densities optimized to form a conformal thin film on a seed layer, to provide bottom-up filling, preferentially on features having the largest aspect ratios, and to provide conformal plating of all features and adjacent field regions. Including a leveling agent in the electroplating bath produces films with better quality after subsequent processing.

22 Claims, 1 Drawing Sheet

U.S. PATENT DOCUMENTS

| | | | | |
|---|---|---|---|---|
| 6,074,544 A | | 6/2000 | Reid et al. | 205/157 |
| 6,099,711 A | | 8/2000 | Dahms et al. | 205/101 |
| 6,113,771 A | * | 9/2000 | Landau et al. | |
| 6,132,584 A | | 10/2000 | Hubel | 205/103 |
| 6,197,181 B1 | * | 3/2001 | Chen | |
| 6,224,737 B1 | * | 5/2001 | Tsai et al. | 205/123 |

OTHER PUBLICATIONS

Shipley, "Ultrafill: Copper Electrochemical Deposition Process For Semiconductor ULSI Damascene Metal Fill Applications", Rev. 1, pp. 1–3, Mar. 17, 1999.

Kelly et al., "Leveling and Microstructural Effects of Additives for Copper Electrodeposition" Journal of The Electrochemical Society 146:7:2540–2545 (1999).

*ULSI Technology*, Eds., C.Y. Chang and S.M. Sze (McGraw–Hill, 1996, p. 444–445).

*Electroplating*, Fredereick A. Lowenheim, (McGraw–Hill, 1978, p. 423).

*Selective and Blanket Electroless Cu Plating Initiated By Contact Displacement*, Valery M. Dubin, Yosi ShachamDiamand and Bin Zhao, P.K. Vasudev, Chiu Ting, (VMIC Conf. Jun. 26 & 27, 1995, pp. 314–321).

*Copper Electroplating Process For Sub–Half–Micron ULSI Microstructures*, Robert J. Contolini, Lisa Tarte, Robert T. Graff, Lee B. Evans, J. Neal Cox, Marc R. Puich, Justin E. Gee, Xaio–Chun Mu, Chien Chaing, (VMIC Conf. Jun. 27–29, 1995, pp. 322–325).

* cited by examiner

ELECTROPLATING PROCESS FOR AVOIDING DEFECTS IN METAL FEATURES OF INTEGRATED CIRCUIT DEVICES

RELATED APPLICATIONS

This application is a continuation-in-part of U.S. patent application Ser. No. 09/410,170, filed Sep. 30, 1999, now abandoned, which claims priority from U.S. Provisional Application Ser. No. 60/105,699, filed Oct. 26, 1998. Application Ser. No. 09/410,170 is incorporated herein by reference.

TECHNICAL FIELD

This invention relates generally to electroplating methods and, in particular, to processes for electrodeposition of metal into small integrated circuit features such as vias and trenches that avoid formation of defects.

BACKGROUND

To achieve faster operating speeds, integrated circuits (IC's) are being developed with smaller feature sizes and higher densities of components. Conductivity of metal interconnections has emerged as a limitation in the development of these high performance devices. Thus, future generations of IC's will tend to substitute copper for the presently used aluminum conductors.

Forming electrically conducting vias, contacts, and conductors of copper or other metals becomes increasingly challenging as feature sizes are reduced. Techniques for forming such metal features include physical vapor deposition (PVD), chemical vapor deposition (CVD), plasma enhanced chemical vapor deposition (PECVD) and electrochemical deposition (also referred to as electroplating or electrodeposition.)

The general nature of the electroplating process is well known. The wafer is immersed in an electrolytic bath containing metal ions and is biased as the cathode in an electric circuit. With the solution biased positively, the metal ions become current carriers which flow towards and are deposited on the exposed surfaces of the wafer. Electroplating is particularly well suited for the formation of small embedded damascene metal features due to the ability to readily control the growth of the electroplated film for bottom-up filling without voids, and due to the superior electrical conductivity characteristics of the electroplated film. However, there are also several obstacles which need to be overcome to fully realize these advantages.

One challenge facing damascene processing techniques is the difficulty of initiating the growth of the metal film within recessed features without forming voids or seams. In typical PVD and some CVD processes, metal may preferentially deposit near the top of recessed features leading to a "bottleneck" shape. Further plating of metal onto the bottleneck may result in sealing the top of the feature before completely filling the feature with metal, creating a void. Voids increase the resistance of the conductor over its designed value due to the absence of planned-for conductor. Also, trapped electrolyte in sealed voids may corrode the metal. This may lead to degraded device performance or device failure in extreme cases.

Other problems include providing even thickness of an electroplated layer across a die on a semiconductor wafer and avoiding defects in the electroplated metal that are subject to attack during a subsequent chemical mechanical polishing step as part of the IC fabrication process. What is needed is an electroplating technique that produces metal films and features without voids or defects.

SUMMARY

Use of an electroplating bath containing metal ions and a suppressor additive, an accelerator additive, and a leveler additive, together with controlling the current density applied to a substrate, provides an electroplating method that avoids defects in plated films while providing good filling and thickness distribution.

Four distinct phases of electrofilling a patterned substrate having a field region and a plurality of recessed features of varying aspect ratios have been identified. In the first phase, the patterned substrate onto which a seed layer has been deposited, is immersed in an electroplating bath. The second phase involves nucleation and island bridging of the seed layer to form a thin conformal conducting film everywhere on the surface. In the third phase, metal is preferentially deposited on the bottom of the features having the highest aspect ratios and proceeds to features having lower aspect ratios as the current density is raised. Finally, the fourth phase pertains to the filling of low aspect ratio features in a rapid, substantially conformal manner.

A method of electroplating a metal onto a surface having a metal seed layer, where the surface comprises a field region and recessed features with a range of aspect ratios, starts with contacting the surface with an electroplating solution comprising metal ions, a suppressor additive, an accelerator additive, and a leveler additive under conditions where the metal seed layer is cathodically polarized with respect to the electroplating solution prior to or less than approximately 5 seconds following contacting. In the second phase, a DC cathodic current density is applied through the surface at a first value of current density that is sufficiently small that depletion of metal ions and the additives is absent at both the field region and the recessed features, to create a substantially conformal thin conductive metal film on the surface. In the third phase, a DC cathodic current density having a second value is applied through the surface, where the second value is selected so that electroplating occurs preferentially on bottoms of recessed features having the largest aspect ratios. As the current density is increased, electroplating progresses to features having smaller aspect ratios. During the second phase, the applied current density is increased from the second value until all recessed features are filled to where they have aspect ratios less than about 0.5. Finally, the current density is increased to a third value that provides a condition of conformal plating, filling recessed features and plating metal onto the field region.

A method is also provided for electroplating a metal onto a continuous conducting surface having a field region and recessed features with a range of aspect ratios. Using an electroplating bath including metal ions, a suppressor additive, an accelerator additive, and a leveler additive, a DC cathodic current density is applied through the surface, where the current density value is selected so that electroplating occurs preferentially on bottoms of recessed features having the largest aspect ratios. The current density is increased until all recessed features have aspect ratios less than 0.5. Finally, the current density is increased to a final value that provides a condition of conformal plating, filling recessed features and plating metal onto the field region.

Including a leveling additive in the electroplating bath modifies grain growth during the third phase and produces a film that is less susceptible to attack during chemical mechanical processing (CMP). Absent inclusion of levelers in the plating bath, the growth of the film in the middle of the features tends to be faster than the growth on the sidewalls. The addition of levelers slows down the growth rate in the center of the features, particularly as the deposit approaches the tops of the openings. Although the benefits of using levelers in the plating bath are not readily apparent immediately after plating, copper films produced without levelers tend to have more holes in the deposit after copper is removed in the field region. Including a leveling additive also reduces the overall topography of the final deposit reducing the total time needed for CMP processing. The thickness of the deposited film is more uniform across the wafer when levelers are included in the electroplating bath and a finer grain structure is obtained.

BRIEF DESCRIPTION OF THE DRAWING

The drawing illustrates a portion of a cross section of a patterned multilayered wafer on which a metal layer may be deposited according to embodiments of the present invention.

DETAILED DESCRIPTION

Figure 1:
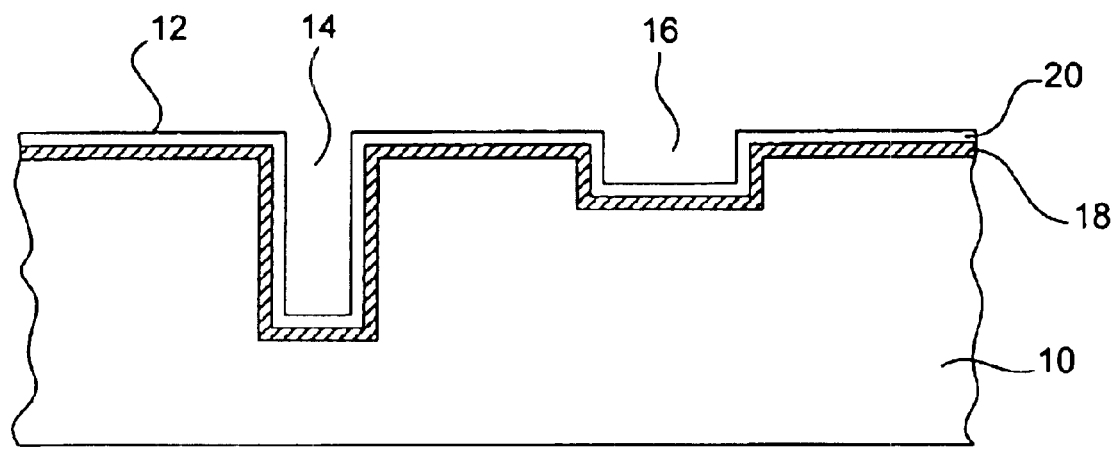

A process of electroplating metal into integrated circuit features without the formation of voids or seams has been described in U.S. patent application Ser. No. 09/41,710, which is termed the "prior application." The prior application defined four phases of the electrofilling process and disclosed controlled current density methods for each phase for optimal filling of small embedded features.

A cross section of a patterned multilayer wafer 10, on which metal is to be electroplated, is illustrated in the drawing. In general, wafer 10 represents several layers of semiconductor material, dielectric material, and other metallic layers. The surface of wafer 10 includes a flat field region 12 and features such as trenches or vias with a range of aspect ratios (AR), defined as the ratio of depth to width. For example, large AR feature 14 and small AR feature 16 are included in the surface of wafer 10. A seed layer 18, typically deposited by a PVD or CVD process overlies the surface of wafer 10. The seed layer may be non-uniform and may exhibit islands, that is the seed layer may not completely cover the surface of all the features of wafer 10.

In the first phase, or "entry phase", a patterned, multilayered substrate such as wafer 10, having a seed layer 18 of the metal to be plated, is immersed into an electroplating bath. The methods of the prior application avoid etching or corrosion of the seed layers within trenches or vias of the patterned substrate during the entry step. The second phase, the "initiation phase," involves the nucleation and island bridging of the seed layer resulting in growth of a conformal initial film 20 everywhere on the surface of the substrate including the recessed regions such as large AR feature 14 and small AR feature 16. The conformal film has sufficient conductivity to facilitate subsequent electrofilling. The third phase, "bottom-up filling phase" involves the preferential deposition of metal on the bottom of high aspect ratio features having AR's greater than about 0.5, leading to bottom-up filling and reduction of the AR's. The final phase, "low aspect ratio filling phase" pertains to the filling of low AR features and plating the field region, in a rapid, substantially conformal manner, until the required metal thickness is achieved.

According to an aspect of the present invention, use of an electroplating bath containing specified additives, together with controlled current density methods for each phase, provides an electroplating method that avoids defects in the plated films while retaining the advantages of good filling and thickness distribution described in the prior application. Typical electroplating baths contain positive ions of the metal to be plated and the associated anions in an acid solution. Copper electroplating is typically performed from a solution of $CuSO_4$ dissolved in an aqueous solution of sulfuric acid. In addition, the electroplating bath contains ppm levels of chloride ions and several additives, classified as accelerators, suppressors, and levelers.

As the name implies, accelerators are additives which increase the rate of the plating reaction. Accelerators are molecules which adsorb on copper surfaces and increase the local current density at a given applied voltage. Accelerators typically contain pendant sulfur atoms, which are understood to participate in the cupric ion reduction reaction and thus strongly influence the nucleation and surface growth of copper films. Accelerator additives are most commonly derivatives of mercaptopropanesulfonic acid (MPS) or dimercaptopropanesulfonic acid (DPS.) Some useful accelerators, alternatively termed brighteners, are described, for example, in U.S. Pat. No. 5,252,196 (hereafter '196), incorporated herein by reference. Accelerators are available commercially, for example as Ultrafill A-2001 from Shipley Company (Marlborough, Mass.) or as SC Primary from Enthone OMI (New Haven, Conn.)

Suppressors are polymers which absorb at a copper surface and decrease the local current density at a given applied voltage, thus retarding plating. Suppressors are added to plating solutions at relatively high concentrations, on the order of from 100 to 2000 mg/l and form uniform adsorbed films at the copper surface that are not strongly dependent on local mass transfer effects. Suppressors are generally derived from polyethylene glycol (PEG), polypropylene glycol (PPG), polyethylene oxide, or their derivatives or co-polymers. Commercial suppressors include Ultrafill S-2001 from Shipley and S200 from Enthone OMI.

The effect of levelers is more complicated than the effects of the other additives and depends on local mass transfer behavior. Levelers are typically cationic surfactants and dyes which suppress current at locations where their mass transfer rate is most rapid. The presence of levelers, therefore, in the plating bath serves to reduce the film growth rate at protruding surfaces or corners where the levelers are preferentially absorbed. Levelers are added to the plating bath at low enough concentrations, usually between about 1 and about 30 mg/l, that absorption differences due to differential mass transfer effects have a significant effect. The differential mass transfer rates of levelers at different locations are a result of differences in diffusion rates to different geometrical locations and of higher electrostatic migration rates to points on the surface at a more negative voltage. To take advantage of the second effect, most levelers are cationic and usually contain protonated nitrogen-based functional groups. Dodecyltrimethylammonium bromide (DTAB) is a leveler of the tetraalkylammonium class. DTAB is cationic in acidic solution and migrates and diffuses to protrusions on a wafer surface. Other specific levelers have been described, for example, in the '196 patent and references therein, in U.S. Pat. Nos. 4,555,135 and 3,956,120, incorporated herein by reference, and in the papers of Kelly et al. (J. Electrochem. Soc. 126, 2540 (1999) and of Mirkova et al. (Surface Technology 15, 181 (1982.) Levelers are available commercially as Liberty or Ultrafill Leveler from Shipley and Booster 3 from Enthone OMI. While the use of levelers has been described previously, the present inventors have discovered the unexpected beneficial effects of avoiding copper film defects, yielding much more specular plated wafer surfaces, when electroplating baths including levelers are used with specific electroplating processes. The inclusion of appropriate concentrations of additives in the electroplating bath has a different and useful effect at each of the four phases of the electroplating process.

Entry Phase

During the entry phase, a metallic seed layer within small features on a wafer surface is subject to corrosion reactions, crystal redistribution, and in general, removal of seed material from the bottom regions of trenches and vias. The goal of the present methods is to avoid etching or corrosion of the seed layer within the trenches or vias while achieving full wetting of the surface. As disclosed in the prior application, corrosion of the seed layer during the entry phase is mitigated by cathodically polarizing the seed layer with respect to the electrolyte solution. The polarization is achieved by pre-setting a power supply connected to the wafer to provide a small DC cathodic current at a current density in the range of from about 0.02 to 5 mA/cm$^2$ just as, or as quickly as possible after, the wafer is immersed in the electrolyte. In a second method, polarization is achieved by applying a slightly negative DC cathodic constant voltage with respect to a reference electrode in the electrolyte, for example, −10 mV, prior to the wafer making contact with the acidic electrolyte.

The wetting characteristics of the electroplating bath play an important role in minimizing defects in the final electroplated film. The composition of the electroplating solution is selected to avoid small non-wetted areas that become defects. Including polymer based surfactants, such as the suppressors derived from PEG and related compounds described above allows wetting of islands or discontinuous seed structures. Also important to wetting is the concentration of acid and salt in the electroplating bath. High acid levels are effective in quickly dissolving any surface oxides and achieving wetting of the metal onto which subsequent plating must take place. As reported in Example 3 below, the present inventors have observed that, in general, higher concentrations of more hydrophilic polymers, such as PEG, reduce the observed pitting on wafer surfaces while more hydrophobic polymers, such as PPG, and polymers of higher molecular weight are associated with increased pitting.

Initiation Phase

The purpose of the initiation phase is to nucleate and grow a relatively thin, typically less than 500 Å thick, conformal film onto a seed layer. The conformal film should fill recesses between the islands of an initially discontinuous seed layer with metal such that the entire structure becomes a single continuous, conducting metal layer without abnormal grain boundaries. The process parameters and bath composition are optimized to avoid holes or nonuniform nucleation that leads to voids in the conducting metal layer, susceptible to future attack. The bath typically contains accelerators such as MPS or DPS which may aid in the nucleation process.

Process conditions use a relatively low DC current so that additives are allowed to absorb from the bulk of the solution and are not significantly depleted anywhere, thus enhancing the formation of a uniform film on an otherwise discontinuous seed layer. One useful process is applying a constant low DC cathodic current in the range of between 0.2 and 5 mA/cm$^2$. Alternatively, the DC cathodic current can be ramped during or at the end of the initiation phase to provide a smooth transition to the starting current of the following bottom-up filling phase.

A second process uses a low DC cathodic current in the range between 0.2 and 5 mA/cm$^2$, which may be constant or ramped, onto which are superimposed short cathodic current pulses in the range of about 25 to 250 mA/cm$^2$ with pulse lengths of about 0.5 to 10 ms at a relatively low duty cycle in the range of 0.2 to 10%. In a third approach, alternating cathodic and anodic current pulses at about 25 to 250 mA/cm$^2$ with pulse lengths of about 0.5 to 10 ms are superimposed on the same magnitude low DC cathodic current at a moderate duty cycle of about 10 to 50%. There is evidence that use of short high current pulses aids in the formation of new nuclei between islands in the film. Some evidence indicates alternating cathodic and anodic pulses is particularly effective. Once the initiation film is grown to a thickness of between about 25 and 400 Å, the electrical conductivity and film morphology has been established for bottom-up filling. The initiation film provides a continuous conducting surface extending over the field region and the recessed features of the substrate surface.

Bottom-up Filling Phase

In the third phase of the process, the bottom-up filling phase, trenches and vias are filled with metal substantially from the bottom of the features upwards. As described in the prior application, bottom-up filling can be achieved using additive mixtures such as an accelerator, DPS, and a suppressor, PEG, and particular process conditions. The bottom-up filling phase starts with an initial current density such that electroplating occurs preferentially at the bottom of the highest aspect ratio features where diffusion of additives is insufficient to replenish additives consumed in electroplating. As the current density is increased electroplating progresses to features having smaller aspect ratios. The prior process exhibits excellent bottom-up filling However, the resulting structure may be subject to attack in later processing due to initially formed irregular grain structure or microvoid formation as initial stress in the deposit is relieved during a subsequent annealing step.

The present inventors have determined that addition of a leveling component to the electroplating bath modifies grain growth thus avoiding high stress and irregular grain growth in the electroplated film. Absent inclusion of levelers in the plating bath, the growth of the film in the middle of the features tends to be faster than the growth on the sidewalls. The addition of levelers slows down the growth rate in the center of the features, particularly as the deposit approaches the tops of the openings where the mass transfer rate is highest. The effect of the leveler DTAB in reducing protrusions over trenches is demonstrated in Example 2 below. When the DTAB leveler was added to the electroplating bath, the height of protrusions over the trenches was reduced to less than a third of the height of the protrusions obtained when no leveler was present in the electroplating bath. The use of levelers in the bath produces a film that is less susceptible to attack during chemical mechanical processing (CMP). Although the benefits of using levelers in the plating bath are not readily apparent immediately after plating, films produced without levelers tend to have more holes in the deposit after copper is removed in the field region.

Typical process conditions for the bottom-up filling phase start with a DC current density in the range of about 0.2 to 5 mA/cm$^2$. The current density is increased over a period in the range of about 3 to 60 seconds to a maximum DC current density of between about 4 and 45 mA/cm$^2$. The bottom-up filling phase continues until all of the features have been converted to low aspect ratios, that is to aspect ratios less than about 0.5.

Low Aspect Ratio Filling Phase

Once essentially all of the features of high aspect ratio have been filled or converted to low aspect ratios, features which are wide with respect to their depth need to be filled. The low aspect ratio filling phase is a substantially conformal filling step. An amount of metal approximately equal to the thickness of the dielectric layer (typically between about 0.7 to 1.4 μm) must be deposited. To maximize the throughput of the process, the highest possible current density should be used that does not lead to a significant reduction in anode service life or additive degradation. In typical plating process conditions a DC cathodic current in the range from about 15 to 75 mA/cm$^2$, more typically from about 20 to 50 mA/cm$^2$, and most typically from about 25 to 40 mA/cm$^2$, is applied. Excess metal deposited in this step is removed in a subsequent metal planarization step. In order to achieve a uniform transition in grain structure, a ramp or series of small current density steps may be employed to adjust the current density between the value at the end of the bottom-up filling phase and the desired value for the low aspect ratio filling phase. In a typical case, the current density is ramped from a bottom-up fill current of 10 mA/cm$^2$ to a low aspect ratio filling current of 50 mA/cm$^2$ over a time period of 10 seconds. The current is maintained at the 50 mA/cm$^2$ level for the duration of the process.

Use of a leveler in the electroplating bath during the low aspect ratio filling phase has several benefits. First, by suppressing the thickness of the deposit over the features, use of a leveler reduces the topography of the final deposit. The overall thickness across the wafer is more uniform. Thickness variation within a die of ±0.1 μm has been obtained using levelers while thickness variation within a die of 1.5–2 μm is common without the use of levelers. Reduced topography reduces the total time needed for CMP processing and provides a film with fewer flaws that are subject to attack during CMP. Second, leveler use results in apparently continuous growth of a finer grain structure deposit throughout the bulk of a copper film as manifested by increased reflectivity of the wafers.

Electroplating Bath

According to an aspect of the present invention, the electroplating bath includes a leveling additive as well as suppressor and accelerator additives. As described above, different additives in the electroplating bath play a key role at different phases of the electroplating process. Suppressors or wetting agents in the bath are important at the entry phase; accelerators are useful in the initiation phase. The inclusion of leveler additives as well as accelerators and suppressors in the electroplating solution at the bottom-up filling and low aspect ratio filling phases has been shown to significantly reduce defects in the metal films. The same electroplating bath, containing all three types of additives, can be used throughout the process together with the current conditions described above. Exemplary bath compositions for electroplating of copper are given in terms of both generic and commercial components in Table 1 below.

TABLE 1

Compositions for Electroplating Copper

| Acid | 0–300 g/l | 0–300 g/l |
|---|---|---|
| Copper ions | 10–60 g/l | 10–60 g/l |
| Chloride ions | 20–200 mg/l | 20–200 mg/l |
| Suppressor | S200 (Enthone OMI) 1–6 ml/l | Dimercaptopropanesulfonic acid (DPS) 2–20 ppm |
| Accelerator | SC Primary (Enthone OMI) 0.5–8 ml/l | Polyethylene glycol (PEG) 10,000 MW 3–1000 ppm |
| Leveler | Booster 3 (Ethone OMI) 0.5–8 ml/l | Dodecyltrimethyl- ammonium bromide (DTAB) 3–30 ppm |

As described in the examples below, inspection of parts plated with DPS/PEG type additives plus the addition of levelers such as DTAB, Enthone-OMI (Booster 3) or Shipley (Liberty), after CMP processing, showed substantial reduction in pit type defects as compared with parts plated in solutions lacking levelers.

Alternatively, electroplating could be performed using two separate baths, in which one bath is optimized for wetting and nucleation for the entry and initiation phases and a second bath including all three types of additives is used for the bottom-up filling and low aspect ratio filling phases.

The features and benefits of the present methods of electroplating of metals onto surfaces having recessed features with a range of aspect ratios are further illustrated but not limited by the following example.

EXAMPLE 1

A copper layer was electroplated onto patterned 200 mm silicon wafers, previously coated with a PVD tantalum barrier and a PVD copper seed layer, using electroplating bath compositions A and B, including a leveler additive and comparison bath composition C, as listed in Table 2 below.

TABLE 2

|  | Bath A* | Bath B** | Bath C |
|---|---|---|---|
| Sulfuric acid | 175 g/l | 175 g/l | 175 g/l |
| Copper ions | 17.5 g/l | 17.5 g/l | 17.5 g/l |
| Chloride ions | 50 mg/l | 50 mg/l | 50 mg/l |
| Suppressor | S200 2 ml/l | Ultrafill S2001 25 ml/l | Ultrafill S2001 25 ml/l |
| Accelerator | SC Primary 1 ml/l | Ultrafill A 2001 1 ml/l | Ultrafill A 2001 1 ml/l |
| Leveler | Booster 3 1 ml/l | Liberty 1 ml/l | None |
| Defects | 68 | 147 | 363 |

*Commercial additives provided by Enthone OMI (New Haven, CT)
**Commercial additives provided by Shipley (Marlborough, MA)

Wafers were processed in Novellus Sabre™ electroplating equipment. The wafers entered the electroplating solution with voltage applied. The initiation current density of 3 mA/cm$^2$ was applied for 11 seconds. The bottom-up fill current density of 10 mA/cm$^2$ was applied for 30 seconds. The low aspect ratio filling current density of 25 mA/cm$^2$ was applied for 91 seconds. A total deposit thickness of 1.0 μm was formed.

After CMP polishing, the wafers were examined for pit type defects. As given in Table 2, the wafers plated in baths A and B, containing levelers exhibited significantly fewer defects than the wafer plated in Bath C, which did not contain a leveling additive.

EXAMPLE 2

The effect of the leveler dodecyltrimethylammonium bromide (DTAB) on the growth of protrusions, excessive growths of copper over features within which bottom-up filling has taken place, was investigated. Patterned wafers with trenches 1.2 μm in depth and varying from 0.15 μm to 1.7 μm in width were electroplated using the comparison Bath C of Example 1 and using Bath D, in which 5 ppm of DTAB was added to the composition of Bath C. The field thickness, thickness over features, and height of the protrusions obtained with Baths C and D are listed in Tables 3 and 4 respectively.

TABLE 3

Height of Protrusions with Comparison Bath C

| Feature width | 1.7 um | 0.9 um | 0.5 um | 0.3 um | 0.2 um | 0.18 um | 0.15 um |
|---|---|---|---|---|---|---|---|
| Field thickness | 0.97 | 0.94 | 0.93 | 0.90 | 0.93 | 0.97 | 0.98 |
| Thickness over feature | 1.45 | 1.66 | 1.8 | 1.65 | 1.31 | 1.27 | 1.16 |
| Protrusion size | 0.48 | 0.72 | 0.87 | 0.75 | 0.38 | 0.30 | 0.18 |

TABLE 4

Height of Protrusions with Bath D

| Feature Width | 1.7 um | 0.9 um | 0.5 um | 0.3 um | 0.2 um | 0.18 um | 0.15 um |
|---|---|---|---|---|---|---|---|
| Field thickness | 1.13 | 1.13 | 1.13 | 1.13 | 1.13 | 1.13 | 1.13 |
| Thickness over feature | 1.05 | 1.33 | 1.21 | 1.21 | 1.14 | 1.13 | 1.13 |
| Protrusion size | −0.05 | 0.20 | 0.08 | 0.08 | 0.01 | 0 | 0 |

When large protrusions are seen, it is clear that an accelerated growth front has proceeded upward within a feature and continued following filling. This accelerated growth can create grain interfaces between the area of accelerated growth and adjacent areas of slow growth which are susceptible to attack during CMP. Without the leveler present, it is observed that protrusions over 0.5 um wide trenches are as high as 0.87 um relative to the adjacent field. When the dodecyltrimethylammonium bromide leveler is added, the protrusions are reduced to a maximum size of 0.2 um on the 0.9 um wide trenches. In accordance with the understanding that reduced protrusions represent more typical or uniform grain interface between the copper over the feature and that on the adjacent field, the tendency for defect generation by etching during CMP is reduced.

EXAMPLE 3

Table 6 shows pitting characteristics observed on wafers electroplated using the polymer suppressor compositions of Table 5.

TABLE 5

Suppressor Composition

| | Molecular Weight | % Polypropylene glycol (PPG) | % Polyethylene glycol (PEG) |
|---|---|---|---|
| PEG1000 | 1,000 | | 100 |
| PEG10000 | 10,000 | | 100 |
| PPG400 | 400 | 100 | |
| PPG2000 | 2,000 | 100 | |
| L31* | 1,100 | 90 | 10 |
| L35* | 1,900 | 50 | 50 |
| L61* | 2,000 | 90 | 10 |
| F68* | 8,400 | 20 | 80 |
| F127* | 12,600 | 30 | 70 |
| L92* | 3,650 | 80 | 20 |
| L43* | 1,850 | 70 | 30 |
| P85* | 4,600 | 50 | 50 |

*Provided by BASF AG (Ludwigshafen, Germany)

TABLE 6

Pit Defect Observation as Function of Suppressor composition

| Wafer ID | Suppressor | Concentration (ppm) | Pit defect observation |
|---|---|---|---|
| — | PEG 1000 | 3 | Pits |
| 1115-25 | PEG 1000 | 30 | Pits |
| 1115-24 | PEG 1000 | 300 | No pits |
| 1115-22 | PEG 10000 | 30 | No pits |
| 1115-21 | PEG 10000 | 300 | No pits |
| 1115-20 | PPG 400 | 30 | Pits |
| 1115-19 | PPG 400 | 300 | Pits |
| 1115-18 | PPG 2000 | 3 | Pits |
| 1115-17 | PPG 2000 | 30 | Pits |
| 1115-16 | L31 | 3 | No pits |
| 1115-15 | L31 | 30 | No pits |
| 1115-14 | L31 | 300 | No pits |
| 1115-13 | L35 | 3 | No Pits |
| 1115-12 | L35 | 30 | Pits |
| 1115-11 | L35 | 300 | Pits |
| 1115-10 | L61 | 3 | Pits |
| 1115-09 | L61 | 30 | Pits |
| 1115-08 | L61 | 300 | Pits |
| 1115-07 | F68 | 3 | No pits |
| 1115-06 | F68 | 30 | No pits |
| 1115-05 | F68 | 300 | No pits |
| 1115-04 | F127 | 3 | Pits |
| 1115-03 | F127 | 30 | Pits |
| 1115-02 | F127 | 300 | No pits |
| 2024-06 | L92 | 3 | Pits |
| 2024-05 | L92 | 30 | Pits |
| 2024-04 | L92 | 300 | Pits |
| 0115-01 | L43 | 300 | No pits |
| 0139-01 | L43 | 300 | No pits |
| — | L43 | 3000 | Pits |
| 0139-22 | P85 | 300 | Pits |
| 2024-03 | P85 | 300 | Pits |

It may be noted that certain polymers, such as PEG 10000 and F68 eliminate the observed pitting on the wafer surface. In general, higher concentrations of more hydrophilic polymers, such as PEG, reduce pitting, while hydrophobic polymers increase pitting. Hydrophobicity increases with both increasing PPG concentration and with increasing molecular weight.

Although the present invention has been described in terms of specific materials and conditions, the description is only an example of the invention's application. Various adaptations and modifications of the processes disclosed are contemplated within the scope of the invention as defined by the following claims.

We claim:

1. A method of electroplating a metal onto a surface comprising a field region and a plurality of recessed features, the recessed features having a range of aspect ratios, the surface having a metal seed layer, the method comprising:
   contacting the surface with an electroplating solution comprising metal ions, a suppressor additive, an accelerator additive, and a leveler additive under conditions wherein the metal seed layer is cathodically polarized with respect to the electroplating solution prior to or less than approximately 5 seconds following the contacting;
   applying a DC cathodic current density through the surface, the current density having a first value that is sufficiently small that depletion of metal ions and the additives is absent at both the field region and the recessed features, to create a substantially conformal thin conductive metal film on the surface;
   applying a DC cathodic current density having a second value through the surface, the second value such that electroplating occurs preferentially on bottoms of recessed features having the largest aspect ratios;
   increasing the current density from the second value until all recessed features have aspect ratios less than about 0.5; and
   further increasing the current density to a third value that provides a condition of conformal plating, filling said recessed features and plating metal onto the field region.

2. The method of claim 1 wherein the leveler additive comprises protonated nitrogen-based functional groups.

3. The method of claim 1 wherein the concentration of the leveler additive in the electroplating solution is between about 1 and about 30 milligrams per liter.

4. The method of claim 1 wherein the suppressor additive comprises a hydrophilic polymer.

5. The method of claim 4 wherein the suppressor additive comprises polyethylene glycol.

6. The method of claim 4 wherein the number of pit defects observed on the surface of the filled recessed features and the field region is smaller than the number of pit defects observed on a surface electroplated with an electroplating bath comprising a hydrophobic suppressor additive.

7. The method of claim 1 wherein a height of protrusions over recessed features is less than a third of a height of protrusions over recessed features electroplated with an electroplating bath lacking a leveler additive.

8. The method of claim 1 wherein the metal ions comprise copper ions.

9. The method of claim 8 wherein the conformal thin conductive film is between about 25 and 400 angstroms thick.

10. The method of claim 8 wherein the metal seed layer is cathodically polarized by applying a DC cathodic current density of between about 0.02 and about 5 milliamperes per square centimeter.

11. The method of claim 8 wherein said first value is between about 0.2 and about 5 milliamperes per square centimeter.

12. The method of claim 11 further comprising cathodic current pulses superimposed on said DC cathodic current density.

13. The method of claim 12 wherein said current pulses have current densities of between about 25 and about 250 milliamperes per square centimeter and pulse lengths of between about 0.5 and about 10 milliseconds.

14. The method of claim 11 further comprising alternating cathodic and anodic pulses superimposed on said DC cathodic current density.

15. The method of claim 14 wherein said current pulses carry current densities of between about 25 and about 250 milliamperes per square centimeter and pulse lengths of between about 0.5 and about 10 milliseconds.

16. The method of claim 11 wherein the second value is between about 0.2 and about 5 milliamperes per square centimeter.

17. The method of claim 16 wherein increasing the current density from the second value until all recessed features have aspect ratios of less than about 0.5 is increasing the current density over a period of between about 3 and about 60 seconds to a maximum current density of between about 4 and about 45 milliamperes per square centimeter.

18. The method of claim 17 wherein further increasing the current density to a third value that provides a condition of conformal plating is further increasing the current density to a value between about 15 and about 75 milliamperes per square centimeter.

19. A method of electroplating a metal onto a continuous conducting surface comprising a field region and a plurality of recessed features having a range of aspect ratios, the method comprising:
   contacting the surface with an electroplating solution comprising metal ions, a suppressor additive, an accelerator additive, and a leveler additive;
   applying a DC cathodic current density through the surface, the current density having a first value such that electroplating occurs preferentially on bottoms of recessed features having the largest aspect ratios;
   increasing the current density from the first value until all recessed features have aspect ratios of less than about 0.5; and
   further increasing the current density to a second value that provides a condition of conformal plating, filling said recessed features and plating metal onto the field region.

20. The method of claim 19 wherein the leveler additive comprises protonated nitrogen-based functional groups.

21. The method of claim 19 wherein the concentration of the leveler additive in the electroplating solution is between about 1 and about 30 milligrams per liter.

22. The method of claim 19 wherein the metal ions comprise copper ions.

* * * * *